United States Patent
Kalwa et al.

[11] Patent Number: 6,021,954
[45] Date of Patent: Feb. 8, 2000

[54] HOUSING, PARTICULARLY OF A VEHICLE HEADLAMP

[75] Inventors: Matthias Kalwa; Dieter Wystrach, both of Lippstadt, Germany

[73] Assignee: Hella KG Hueck & Co., Lippstadt, Germany

[21] Appl. No.: 09/041,444

[22] Filed: Mar. 12, 1998

[30] Foreign Application Priority Data

Mar. 15, 1997 [DE] Germany ............... 197 10 822

[51] Int. Cl.$^7$ .................................................. B01F 3/02
[52] U.S. Cl. ............................... 236/44 R; 362/294
[58] Field of Search ............... 236/44 R, 44 A; 34/491; 362/294; 234/44 A

[56] References Cited

U.S. PATENT DOCUMENTS 3,930,612  1/1976  Brakebill et al. ............ 236/44 R
4,780,254  10/1988  Ando ............................ 261/81
5,642,935  7/1997  Schmitt ........................ 362/294

*Primary Examiner*—Henry Bennett
*Assistant Examiner*—Melvin Jones
*Attorney, Agent, or Firm*—Griffin, Butler, Whisenhunt & Szipl, LLP

[57] ABSTRACT

A housing, particularly of a vehicle headlamp, has aeration of its interior housing space via at least one hole for admission and/or exiting of air flows, wherein a switch apparatus, that changes a cross section of flow as a function of humidity of the air, is positioned in the at least one hole to move automatically from a closed position into an open position and vice versa. A method for aerating the interior space of the housing involves air entering the interior housing space via at least one air admission hole and exiting the interior housing space via at least one air exit hole, with aeration occurring only if condensation is present in the interior housing space and if a humidity of the entering air is lower than a humidity of the air in the interior housing space.

10 Claims, 5 Drawing Sheets

HOUSING, PARTICULARLY OF A VEHICLE HEADLAMP

BACKGROUND OF THE INVENTION

This invention relates to a housing, particularly of a vehicle headlamp, having aeration of an interior space of the housing by use of at least one hole for admission and/or exit of flows of air.

The invention further relates to a method for aerating an interior space of a housing, particularly of a vehicle headlamp, wherein air enters the interior space of the housing via at least one air admission hole and air exits via at least one air exit hole.

German patent documents (DE 33 28 788 A1) and (DE 30 04 413 C2) disclose aerated housings wherein at least two holes having cross sections appropriate for low-pressure gas flows are provided.

In general, these holes are positioned so that ventilation of an inside of a unit takes place when flows around the unit are steady (e.g. relative wind is at a constant vehicular speed, or weather-related wind). By contrast, no exchanges of masses of air or gas take place in ventilated systems when the flow about the unit is steady; such exchanges occur only when there are temporary changes in pressure (e.g. pressure impacts when flow speeds about the unit change). For example, while volume flows of one to several liters per minute are measured in aerated housings, net flow rates are lower by an order of magnitude of one to three in housings that are merely ventilated (essentially owing to oscillating air or gas columns). One consequence of these varying flow rates is that, in proportion to a given flow rate, various contaminants are drawn into such housings via ambient air. Contaminants are introduced that have a corrosive effect on the one hand (e.g. on reflector coatings, etc.), and that have a negative esthetic impact owing to formation of visible deposits, on the other hand. An advantage of having an aerated housing is that esthetically adverse visible condensation can be dried significantly faster (drying) than is the case with ventilated housings because of the higher flow of air. A disadvantage of aerated housings is that, under acute condensation conditions, more condensation generally forms faster in interior spaces thereof than in ventilated housings.

Use of filters to influence a relationship between contamination and drying is known in the art. However these filters must be designed to offer only minimal resistance to flow of air through a unit, since an available pressure differential between aeration holes is very low. Therefore small filters must necessarily be relatively macroporous, but then the finest contaminants (e.g. aerosols) can be filtered out only to a limited extent. A use of appropriate microporous filters would require very large filter cross sections in order to achieve a flow rate necessary for sufficiently rapid drying.

It is an object of this invention to improve a housing having aeration of an interior space thereof, so that an overall contaminant load is reduced and any water deposits can dry quickly.

It is a further object of the invention to provide an improved method for aerating the interior space of a housing such that introduction of contaminants is reduced and introduction of outside air with higher humidity than air in the interior space is reduced.

SUMMARY OF THE INVENTION

According to principles of the invention a switch apparatus that changes a cross section of flow as a function of air humidity is placed in a hole, and is moved automatically from a closed position into an open position and vice versa.

Also according to principles of the invention aeration takes place only when condensation is present in an interior space of a housing, and when humidity of incoming air is less than humidity of air in the interior of the housing.

BRIEF DESCRIPTION OF THE DRAWING

The invention is described and explained in more detail below using an embodiment shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 13:
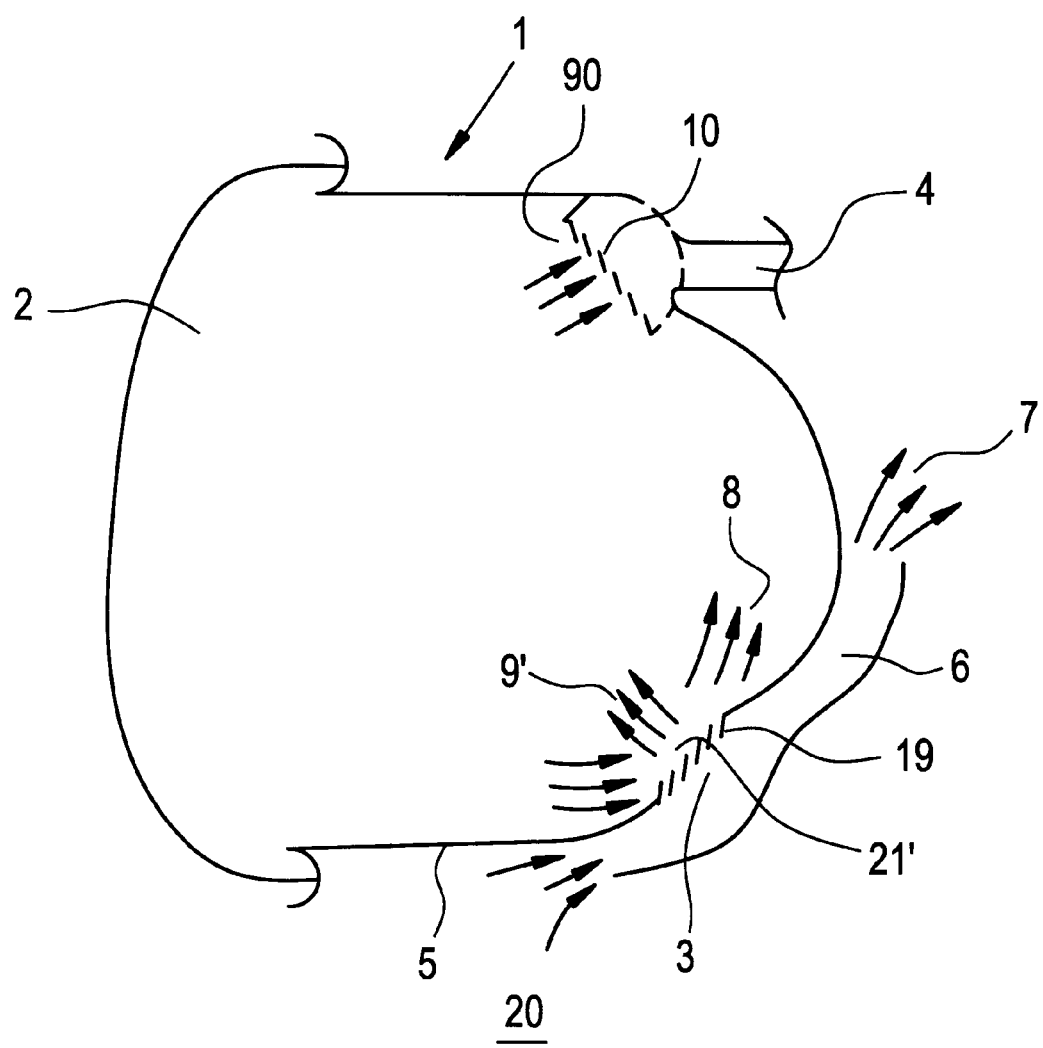
FIG. 13 is a schematic cross-sectional profile representation of a vehicle headlamp housing of this invention.

A housing 1, designed as a headlamp housing for motor vehicles for example, substantially defines an interior housing space 2, having an air admission hole 3 and an air exit hole 4, see FIG. 13. On an exterior 5, facing away from the interior housing space 2, outer air circulation 7 is directed toward the air admission hole 3 via a flue 6. Outside air entering the interior housing space 2 via the air admission hole 3 is then released from the interior housing space 2, by means of inner air circulation 8, via the air exit hole 4. A first switch apparatus 10 that changes a cross section of flow 9 as a function of atmospheric humidity is positioned in the air exit hole 4 at the inside of the interior housing space 2, with the switch apparatus 10 increasing the cross section of the air exit hole 4 when humidity in the interior housing space 2 is high and reducing the cross section when such humidity is low.

Alternately, a single, large air hole can also be provided whereby, because of effects of the flue, an area for air admission, on the one hand, and an area for air exiting, on the other hand, are provided.

Figure 1:
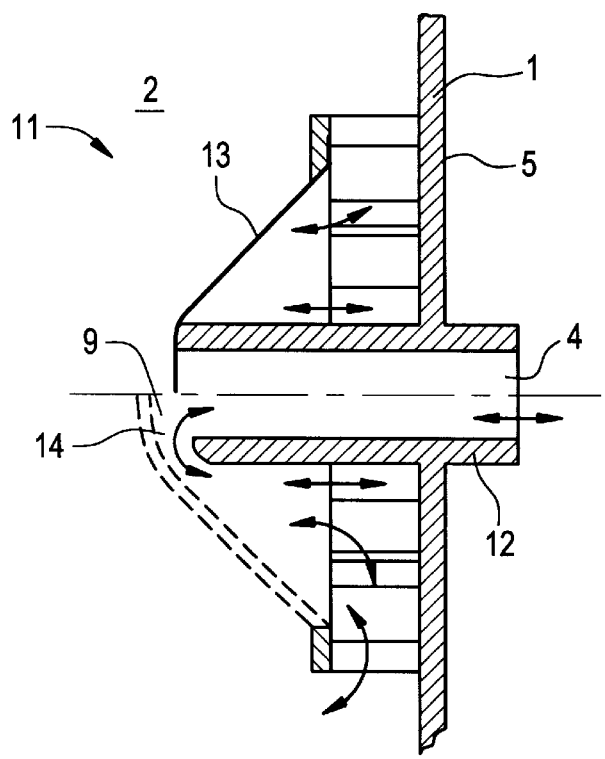
FIG. 1 is a cutaway side view of a schematic representation of a membrane apparatus of this invention, with a membrane element being shown in two different positions.

In a first embodiment as in FIG. 1, the first switch apparatus 10 is structured as a membrane apparatus 11 having a membrane 13 stretched across one end of a tube 12, which stretches as it absorbs moisture, opening up an annular gap 14 at an end of the tube 12 so that moist inside air can be vented outwardly.

Figure 2:
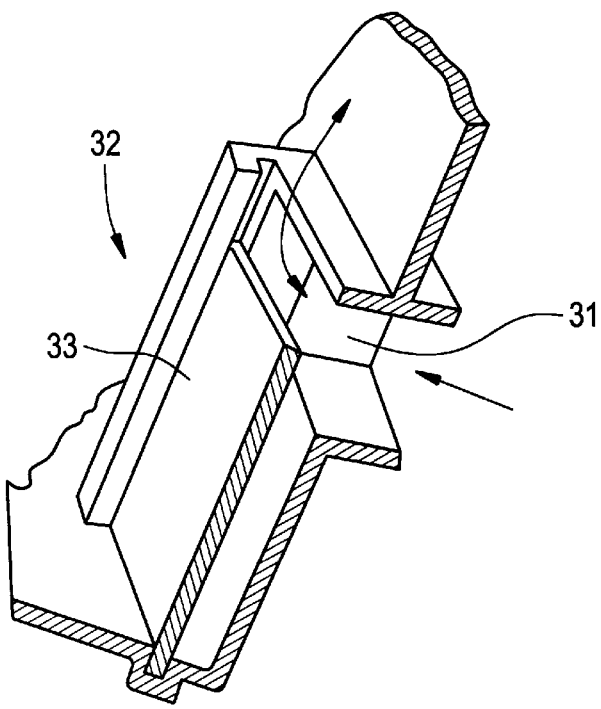
FIG. 2 is an isometric, cutaway, representation of a profile view of a slide element of this invention.

If a cross section formed as a flow gap 31 is to be closed through absorption of moisture, a slide apparatus 32, as in FIG. 2, can be used instead of a membrane apparatus 11. A slide 33 thereof undergoes a dimensional change, particularly lengthwise, through absorption of moisture, thus closing the flow gap 31.

Figure 3:
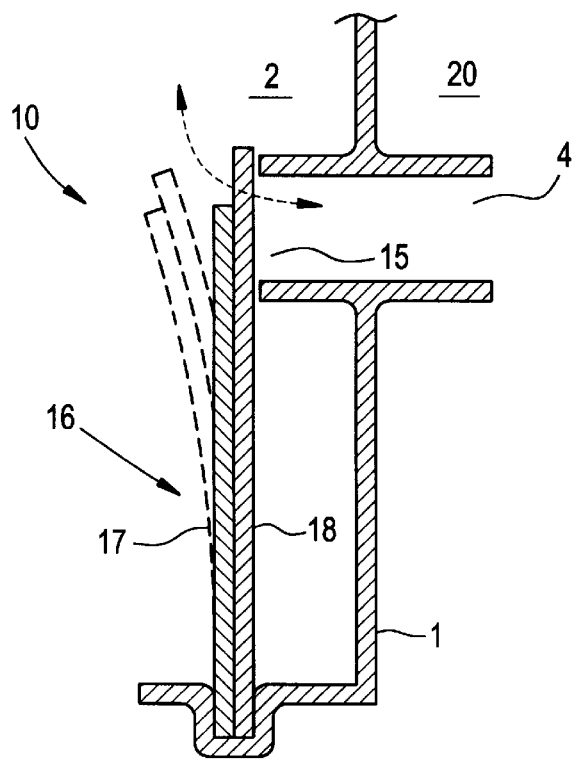
FIG. 3 is a cross-sectional schematic view of a switch apparatus of this invention, along with its mounting, structured as a tongue that changes a cross section.
Figure 5:
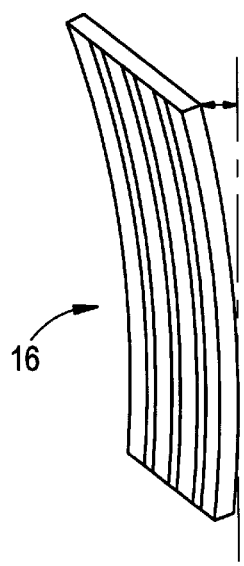
FIG. 5 is an isometric view of the tongue of FIG. 4, but when air moisture is present.

According to another embodiment as in FIG. 3, however, the first switch apparatus 10 can also be structured to include a tongue 16 that changes a cross section 15. The tongue 16 can include two different materials having differing moisture expansion characteristics, and is structured so that an absorption of moisture results in a bending that opens the cross section 15. A back 17 of the tongue 16, facing away from the cross section 15, is made of a material having low moisture expansion characteristics. On a front 18 facing away from the back 17, the tongue 16 has a material with higher moisture expansion characteristics, so that proportional bending occurs as shown in FIG. 5, which opens the cross section 15.

Figure 4:
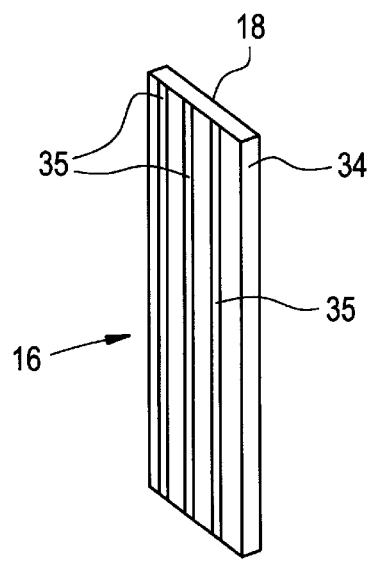
FIG. 4 is an isometric view of a switch element of this invention structured as a tongue, in a dry state.

Preferably the tongue 16 has a polyamide foil 34 on the front 18, while on the back 17, the tongue 16 has glass fibers 35 bonded to a polyamide foil 34, see FIG. 4. FIG. 5 shows the tongue 16 in an open position, while the tongue 16 is shown in the closed positioned in FIG. 4. Instead of glass fibers 35, other materials can be utilized here that have, for example, a thermal expansion coefficient similar to that of the polyamide foil 34. In that case, the bending occurs independently of a temperature of the tongue 16. The moisture switch characteristics can also overlap with temperature switch characteristics by appropriate selection of materials.

Figure 6:
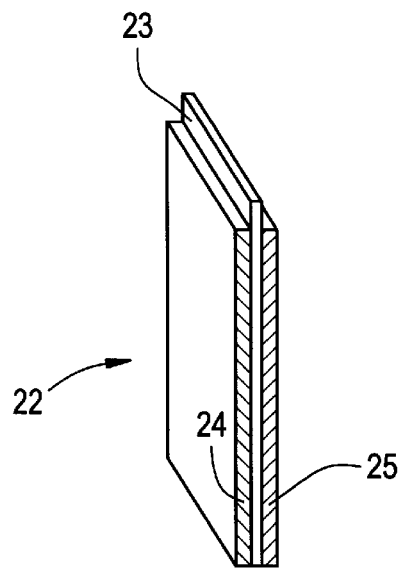
FIG. 6 is am isometric view of a switch element of this invention structured as a tongue having two layers with moisture expansion properties, separated from each other by a diffusion blocker.
Figure 7:
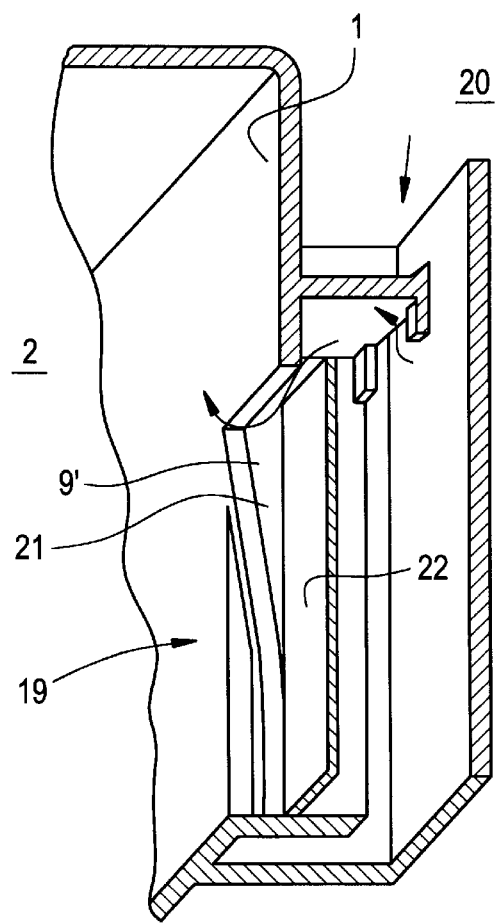
FIG. 7 is a cutaway isometric representation of a housing of this invention, partially in profile, with the tongue of FIG. 6.

A second switch apparatus 19 is positioned at the air admission hole 3 shown in FIG. 13, toward the interior housing space 2. The cross section of flow 9' of the air admission hole 3 can be changed as a function of a differential value between a humidity inside the interior housing space 2 and an outside humidity of an external space 20 located outside the interior housing space 2. As shown in FIGS. 6 and 7, the second switch apparatus 19 is formed as a second tongue 22 that changes a second cross section 21. The second tongue 22 includes two layers 24, 25 separated from each other by a diffusion blocker 23, having moisture expansion characteristics such that a difference between inside and outside moisture levels results in bending, which opens up the second cross section 21. The first layer 24 and the second layer 25 can be made of a single material or of two different materials having marked moisture expansion characteristics. The diffusion blocker 23 has a high degree of diffusion resistance against water vapor. Depending on a combination of materials, the bending of this second tongue 22 correlates to a difference in relative moisture content in the two spaces 2, 20.

Figure 8:
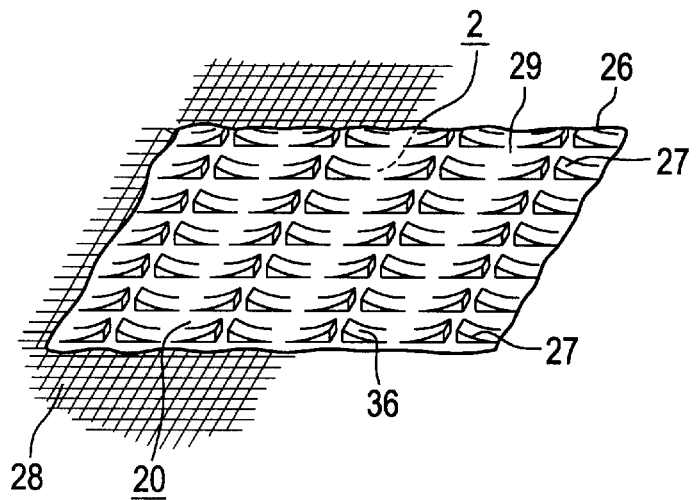
FIG. 8 is an isometric segmented view of a switch element of this invention structured as a foil piece having a number of cut-out tongues with an accompanying pre-positioned latticed foil.
Figure 9:
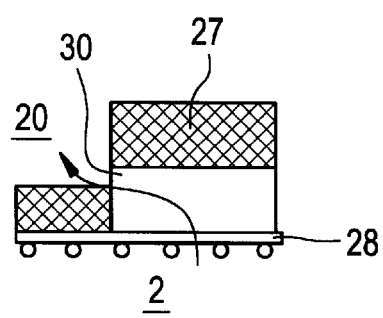
FIG. 9 is an enlarged cross-sectional representation of a portion of the tongue and latticed foil of FIG. 8, in a cutaway.
Figure 10:
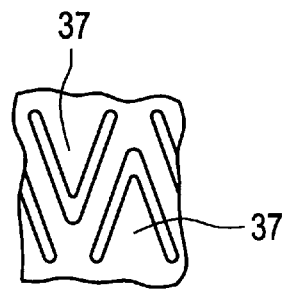
FIG. 10 is a plan, segmented, top view of a foil piece with cut-out tongues of this invention.
Figure 11:
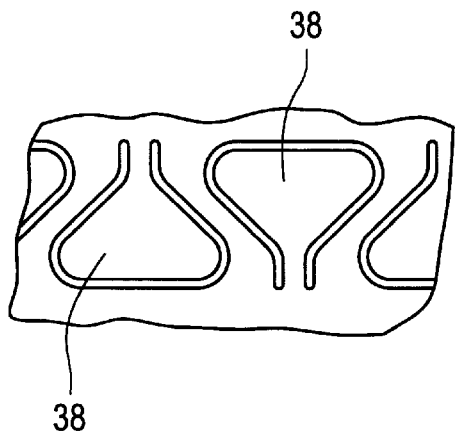
FIG. 11 is a segmented top plan view of a foil piece having cut-out tongues of this invention.
Figure 12:
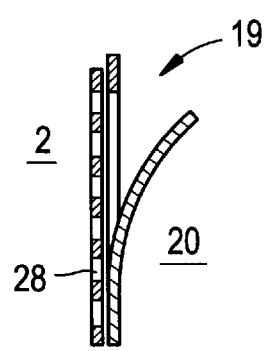
FIG. 12 is a segmented cross-sectional view of a switch apparatus formed from an actuator foil have cut-out tongues and a pre-positioned latticed foil.

In an additional embodiment as in FIG. 8, the second switch apparatus 19 can also be structured as a one-piece foil piece 26 that changes the second cross section 21, having marked moisture expansion characteristics and a number of cut-out tongues 27. The foil piece 26 has a latticed foil 28 on a face directed toward the interior space 2, so that the tongues 27 are prevented from bending in toward the interior space 2 by the latticed foil 28. The cut-out tongues 27, therefore, open only if there is greater moisture content in the interior housing space 2 than at the external space 20. In the opposite case, and when the moisture content is the same, the tongues 27, or the second switch apparatus 19, remain(s) closed. A significant difference between interior and exterior humidity, therefore, results in the plurality of tongues 27 bending in the direction of the external space 20 facing away from the latticed foil 28, thereby opening a plurality of holes 30 corresponding to the contours of the tongues 27. Such tongues 27 can be cut out by punching out U-shaped tongues 36, Λ-shaped tongues 37 (FIG. 10), or Ω-shaped tongues 38 (FIG. 11), so that, at one end, the tongues 36, 37, 38 are connected to the foil piece 26 and are thereby fixed in position relative to their respective individual notches. The respective second cross section 21 ("A") is respectively opened as a function of differences in moisture ($\Delta F$) and pressure ($\Delta p$) on opposite sides of the second switch apparatus 19 ($A=f(\Delta F, \Delta p)$). The cross section "A" is determined by a product of a humidity-related surface factor $a_{\Delta F}$ and a difference in the moistures ($\Delta F$) and by a product of a pressure-related surface factor $a_{\Delta p}$.

Thus: $A=f(\Delta F, \Delta p)=a_{\Delta F}\cdot\Delta F+a_{\Delta p}\cdot\Delta p$. In a case of the Λ-shaped tongue 37: $|a_{\Delta F}|>>|a_{\Delta p}|$, and in a case of the Ω-shaped tongue 38: $|a_{\Delta F}|<<|a_{\Delta p}|$.

If the two gas spaces 2, 20 have the same temperature level in an immediate vicinity of the tongue surfaces, through appropriate shaping of flow areas on the two sides of the tongues, a bending of the tongues 22, 27 correlates to a difference in absolute moisture content of the two gas spaces 2, 20.

Alternately, the second switch apparatus 19 can also be designed as a single, large-surface tongue. This is particularly suitable for an embodiment having a single hole in the housing.

By adapting shapes and dimensions (contour and thickness) of the tongues 16, 22, 27, 37, 38 to typical operating differences in pressure between the gas spaces 2, 20, a pressure-differential switching characteristic can overlap with the moisture and, if applicable, temperature switch characteristics.

The described switch apparatus 10, 19 are not completely tight in the "closed" position, but the free cross section of flow 9, 9' is reduced to a substantial minimum. Depending on the embodiment, cross section ratios of up to 1:1,000 (closed:open) can be achieved.

The described switch apparatus 10, 19 are provided with tongue-shaped punch-outs 16, 22, 27 of round or rectangular foil pieces (2 to 5 cm$^2$). During fabrication, these foil pieces are applied to a framework-like support (glued or welded), with which this pre-assembled group being fastened into the housing 1 (by snapping or hot-melt gluing). However, the contours of the foil pieces can also be coated with a bonding glue on one side, supplied as strip goods (like labels) and glued directly into the housing 1.

Starting at a specific threshold value of the humidity of the air in the interior space 2 of the housing 1, i.e. when condensation is present, the first switch apparatus 10 that is positioned at the air exit hole 4 opens, and thereby opens up, or increases the cross section of, the cross section of flow 9. In this manner, a "need" for aeration is recognized. If a difference between the inside moisture (humidity of the air in the interior housing space 2) and the outside moisture of the entering air or the outer air circulation 7 exceeds a specific threshold, the second switch apparatus 19, positioned at the air admission hole 3, also opens toward the interior housing space 2, and thereby opens up, or increases, the cross section of flow 9'. In this manner, air with lower humidity than the humidity of the inside air of the interior housing space 2 can enter the interior housing space 2, from the outer air circulation 7, through the air admission hole 3, break down the condensation via the inner air circulation 8, and exit at a higher level of humidity through the air exit hole 4. Thus aeration occurs, and with it, drying.

If the outside humidity is greater than the inside humidity, the second switch apparatus 19 does not open, and, rather than aeration, only ventilation takes place. In this instance, aeration would not be meaningful because, by introducing air having greater humidity, the inside humidity and thus the condensation would increase undesirably. No drying could take place under such circumstances.

The invention finds application in any housing, including housings containing electronic components, for example. Housings are understood to include buildings ventilated with fresh, dry outside air.

Flow of air through an interior space of a housing can be regulated advantageously as a function of air humidity with this invention. When humidity is low, the switch apparatus can reduce the cross section of flow to establish a lower flow rate or air flow, thereby decreasing introduction of contaminants.

In a preferred embodiment, the switch apparatus is structured to have a membrane spanned across one end of a tube; the membrane stretches as humidity increases, opening up an annular gap at the end of the tube. Thus the interior space of the housing is easily connected to the exterior through the annular gap, as a function of an inside humidity of the interior space of the housing.

In another preferred embodiment of the invention, the switch apparatus is structured to have a tongue that changes a cross section of flow. The tongue is of two different materials having different moisture expansion properties, so that an increase in humidity results in bending, which opens up the cross section. A specific moisture switch characteristic can be achieved by appropriately selecting the two different materials having the different moisture expansion properties. In addition, a moisture switch characteristic can overlap with a temperature switch characteristic.

In another preferred embodiment of the invention, the housing has a switch apparatus that changes the cross section of flow of at least one of the holes, as a function of a differential value based on the inside humidity of the interior space of the housing and the outside humidity of the exterior space located outside the interior space of the housing. Thus the cross section of flow is opened, or increased, only when the interior humidity is greater than the exterior humidity. Advantageously, undesired outside moisture can thus be prevented from entering the housing. Aeration of the housing is converted, so to speak, into ventilation, with a correspondingly reduced introduction of contaminants.

In another preferred embodiment of the invention, the switch apparatus is structured to include a cross-section-changing tongue that includes two layers that have distinctive moisture expansion properties separated from each other by a diffusion blocker, such that a difference between inside and outside humidity results in bending that opens the cross section. Temperature characteristics can be made to overlap moisture-switch characteristics in this instance, as well, through use of appropriate selection of materials.

Organic materials that take on moisture until a state of saturation is reached, correlating with an existing ambient moisture concentration, are particularly suitable for use as the materials having the distinctive moisture expansion properties, with the absorption of moisture involving swelling processes that are macroscopically observable as a change of dimension. Materials having a large surface/volume ratio are used to keep a diffusion-related time delay of a switch process as short as possible. Therefore, foils, or porous, open-celled formations (foams) are particularly appropriate. For example, polyamide foil is used as a material.

In another preferred embodiment of the invention, the switch apparatus is structured to include as a foil piece that changes the cross section, having distinctive moisture expansion properties and at least one cut-out tongue; the foil piece having a latticed foil on one side and being structured so that a difference between inside humidity and outside humidity results in the tongue or tongues bending in a direction away from the latticed foil, thereby opening a cross section of flow corresponding to the contour(s) of the tongue(s). This embodiment is particularly easy and inexpensive to implement.

In another preferred embodiment of the invention, the air admission hole can be closed and opened by a first switch apparatus as a function of the differential value between the inside and outside humidity, and the air exit hole can be opened and closed by a second switch apparatus as a function of the inside humidity. In this way, it is easy to switch back and forth from aeration to ventilation, as a function of interior humidity and exterior humidity.

In a known method for aerating an interior space of a housing, it is disadvantageous that when an air flow rate or volume flow rate is high, contaminant introduction is also high. Aeration occurs as a function of flow of air around a vehicle, thus resulting in nearly constant aeration and a corresponding introduction of contaminants. Aeration also occurs when outside humidity is higher than inside humidity, so that undesired moisture is introduced into the inside of the housing.

Because with this invention the aeration occurs as a function of both outside and inside humidity, the overall introduction of contaminants is significantly reduced. Equipment is aerated only when necessary and reasonable. Aeration is only necessary when condensation is present in the interior space of the housing. If the inside of the housing is sufficiently dry, ventilation alone is adequate. Aeration is reasonable only when entering outside air is sufficiently capable of evaporating moisture and transporting it out of the interior of the unit. If existing condensation cannot be removed, aeration does not occur and thus nearly no contaminants are introduced. In this regulated ventilation arrangement, contaminants are introduced into equipment only in intentional desiccation, or drying, phases, which are relatively short in comparison to total operation time.

In a preferred embodiment of a method of this invention, the cross section of flow of the air admission hole is modified by a switch apparatus, as a function of a difference between the outside and inside humidity of the air, and the cross section of flow of the air exit hole is modified by a switch apparatus as a function of the inside humidity of the air. In this way, it is easy to regulate aeration as a function of outside humidity and inside humidity of the air, and to switch from aeration to ventilation.

A method according to the invention can essentially be implemented using electronic switch apparatus instead of the switch apparatus described above. The switch apparatus can have electronic moisture sensors that indicate moisture content of gases in the form of a proportional electrical signals. These signals can be fed via an evaluator to electrical actuators that change the cross sections of flow.

The invention claimed is:

1. A housing having aeration of an interior space (2) of a housing via at least a first hole for admission and/or exit of air flows, wherein a switch apparatus (10, 19) that changes a cross section of flow (9) of said first hole as a function of air moisture is positioned at the first hole, and moves automatically from a closed position into an open position, and vice versa, as a function of air moisture.

2. A housing as in claim 1, wherein the switch apparatus (10, 19) changes the cross section of flow (9) of said first hole as a function of inside humidity of the interior housing space (2).

3. A housing as in claim 2, wherein the switch apparatus (10) includes a membrane (13) spanned across one end of a tube (12) that is caused to stretch by absorption of moisture and which thereby opens a gap (14) at an end of the tube (12).

4. A housing as in claim 2, wherein the switch apparatus (10) includes a tongue (16), said tongue comprising two different materials having different moisture expansion characteristics so that absorption of moisture results in bending of the tongue, which opens up the cross section of flow.

5. A housing as in claim 1, wherein the switch apparatus changes the cross section of flow (9) as a function of a differential value between an inside humidity of the interior housing space (2) and an outside humidity of an exterior space (20) located outside the interior housing space (2).

6. A housing as in claim 5, wherein the switch apparatus (10, 19) is structured as a tongue (22) that changes the cross section of flow, said tongue comprising two layers (24, 25) having moisture expansion characteristics separated from each other by a diffusion blocker (23), such that a difference between inside humidity and outside humidity results in bending of the tongue that increases or decreases the cross section of flow.

7. A housing as in claim 5, wherein the switch apparatus (19) comprises a foil piece (26), that can close the cross section of flow (21'), having moisture expansion characteristics and a number of cut-out tongues (27), and a guide element (28) positioned on a side of the foil piece (26) facing the interior space (2), so that a difference between inside humidity and outside humidity results in bending of the tongues (27), only in a direction toward the exterior space (20), away from the guide element (28), and thereby opens a plurality of holes (30) corresponding to contours of the tongues (27).

8. A housing as in claim 5, wherein there are first and second holes, with the first hole being an air-exit hole (4) and the second hole being an air-admission hole (3) the air exit hole (4) can be covered and uncovered by a first switch apparatus (10) as a function of the inside humidity, and the air admission hole (3) being covered and uncovered by a second switch apparatus (19), as a function of a differential value between inside humidity and outside humidity.

9. Method for aerating an interior space of a housing, comprising the steps of: allowing air flow into the interior housing space via at least one air admission hole (3) in a controlled manner, allowing air flow from the interior housing space via at least one air exit hole, increasing at least one of the air flows if condensation is present in the interior housing space (2) and if the humidity of the entering air is lower than the humidity of the air in the interior housing space (2).

10. Method as in claim 9, wherein a cross section of flow of at least one of the air admission hole (3) and the air exit hole (4) is changed by a switch apparatus (19) as a function of a difference between humidity of air outside and inside the interior housing space, and wherein a cross section of flow of at least one of the air admission hole (3) and the air exit hole (4) is changed by a switch apparatus (10) as a function of the humidity of the air inside the interior housing space.

* * * * *